US005934996A

United States Patent [19]

Nagai et al.

[11] Patent Number: 5,934,996

[45] Date of Patent: Aug. 10, 1999

[54] SEMICONDUCTOR ASSEMBLING METHOD AND APPARATUS

[75] Inventors: Yoshiyuki Nagai, Toyonaka; Shinzou Eguchi, Hirakata, both of Japan

[73] Assignee: Matsushita Electric Industrial Co., Ltd., Osaka-fu, Japan

[21] Appl. No.: 08/689,912

[22] Filed: Aug. 16, 1996

[30] Foreign Application Priority Data

Aug. 18, 1995 [JP] Japan .................................... 7-209822

[51] Int. Cl.[6] .................................................... H01L 21/44

[52] U.S. Cl. ........................ 458/617; 438/612; 228/180.5

[58] Field of Search .................................... 438/617, 612, 438/613, 111, 123; 228/180.5

[56] References Cited

U.S. PATENT DOCUMENTS

| | | | |
|---|---|---|---|
| 5,123,585 | 6/1992 | Terakado et al. | 228/180.5 |
| 5,124,277 | 6/1992 | Tsumura | 438/617 |
| 5,323,952 | 6/1994 | Kato et al. | 228/180.5 |
| 5,402,927 | 4/1995 | Frasch | 228/180.5 |
| 5,615,821 | 4/1997 | Sasano | 228/180.5 |
| 5,653,380 | 8/1997 | Haji | 228/180.5 |
| 5,773,311 | 6/1998 | Cullinan et al. | 438/617 |

*Primary Examiner*—Kevin M. Picardat

*Attorney, Agent, or Firm*—Wenderoth, Lind & Ponack, L.L.P.

[57] ABSTRACT

A semiconductor assembling method joins a bonding wire with a bonding object by pressing the bonding wire against the bonding object with a bonding pressurizing tool and by effecting at least either one junction process of thermal junction or ultrasonic junction. The method includes steps of measuring a time elapsing from a last bonding process to a subsequent bonding process or a temperature of the pressurizing tool, and changing at least one junction condition of pressurizing force, pressurizing time, ultrasonic oscillation output, and ultrasonic oscillation time for the subsequent bonding process, based on the measured time. A semiconductor assembling apparatus including a measuring device for measuring the time or temperature and a junction condition changing device for changing the condition to perform the method.

10 Claims, 4 Drawing Sheets

9 MAIN CONTROLLER

DATA STORAGE 10

CALCULATING MEANS 11

T

BONDING-INTERVAL MEASURING MEANS 12

1

13

PRESSURIZING FORCE AND TIME CONTROL MEANS

2

4

8

ULTRASONIC OSCILLATION OUTPUT AND TIME CONTROL MEANS

O

3

7

6

5

MAIN CONTROLLER
9
CALCULATING MEANS
11
DATA STORAGE
10
PRESSURIZING FORCE AND TIME CONTROL MEANS
13
ULTRASONIC OSCILLATION OUTPUT AND TIME CONTROL MEANS
8
PRESSURIZING TOOL TEMPERATURE MEASURING MEANS
15
1
2
3
4
5
6
7
14

TIME MEASURING MEANS
DATA STORAGE
MAIN CONTROLLER
CALCULATING MEANS
PRESSURIZING FORCE AND TIME CONTROL MEANS
ULTRASONIC OSCILLATION OUTPUT AND TIME CONTROL MEANS
BALL FORMING MEANS
18
10
9
11
13
8
7
4
1
3
17
6
5
2
16
117

SEMICONDUCTOR ASSEMBLING METHOD AND APPARATUS

BACKGROUND OF THE INVENTION

The present invention relates to a semiconductor assembling method and apparatus for joining semiconductor chips with lead frames and the like in semiconductor fabrication processes.

Semiconductor chips are connected with external electrodes, such as lead frames, by means of a wire made of gold, aluminium or the like and by using a wire bonder. This wire is connected with the semiconductor chips or external electrodes by heat or ultrasonic waves or by both.

Among the wire bonders, in each of those using the bonding process so called ball bonding, a ball is formed at the tip of the wire by electric discharge or other heating means. The junction conditions for this process include the temperature of the stage at which semiconductor chips and external electrodes are heated, the pressure with which the wire is pressed as well as its time, and the oscillation output of ultrasonic waves as well as its time.

These conditions are previously stored as data in the wire bonder. These data are given as fixed data in all, or fixed data for each wire.

In the case where the wire bonder performs bonding processes continuously for a plurality of wires, the pressurizing tool receives heat from the semiconductor chip heater, resulting in a temperature rise. The ball also comes to a high temperature because the bonding process is carried out immediately after the formation of the ball.

However, when the interval from one bonding process to another is prolonged, for example, during the transfer of semiconductor chips or at a restart after a halt, the temperature of the pressurizing tool or the ball would lower. This poses an issue that the alloying of the wire and the semiconductor chip is suppressed such that a deterioration in the bondability may occur.

SUMMARY OF THE INVENTION

An object of the present invention is therefore to provide semiconductor assembling method and apparatus which allow the junction to be accomplished without being affected by temperature decreases of the pressurizing tool or the ball even if the interval to the subsequent bonding process is prolonged.

In accomplishing these and other objects, according to a first aspect of the present invention, there is provided a semiconductor assembling method for joining a bonding wire with a bonding object by pressing the bonding wire against the bonding object with a bonding pressurizing tool and by effecting at least either one junction process of thermal junction or ultrasonic junction, the semiconductor assembling method comprising steps of:

measuring a time elapsing from a last bonding process to a subsequent bonding process; and changing at least one junction condition of pressurizing force, pressurizing time, ultrasonic oscillation output, and ultrasonic oscillation time for the subsequent bonding process, based on the measured time.

According to a second aspect of the present invention, there is provided a semiconductor assembling method for joining a bonding wire with a bonding object by pressing the bonding wire against the bonding object with a bonding pressurizing tool and by effecting at least either one junction process of thermal junction or ultrasonic junction, the semiconductor assembling method comprising steps of:

measuring a temperature of the pressurizing tool; and changing at least one junction condition of pressurizing force, pressurizing time, ultrasonic oscillation output, and ultrasonic oscillation time for the subsequent bonding process, based on the measured temperature.

According to a third aspect of the present invention, there is provided a semiconductor assembling method for joining a bonding wire with a bonding object by forming a ball at a tip of the bonding wire with energy applied to the bonding wire, by pressing the bonding wire against the bonding object with a bonding pressurizing tool, and by effecting at least either one junction process of thermal junction or ultrasonic junction, the semiconductor assembling method comprising steps of:

measuring a temperature of the tip of the bonding wire; and changing at least one junction condition of pressurizing force, pressurizing time, ultrasonic oscillation output, and ultrasonic oscillation time for the subsequent bonding process, based on the measured temperature.

According to a fourth aspect of the present invention, there is provided a semiconductor assembling method for joining a bonding wire with a bonding object by pressing the bonding wire against the bonding object with a bonding pressurizing tool and by effecting at least either one junction process of thermal junction or ultrasonic junction, the semiconductor assembling method comprising steps of:

measuring a time elapsing from when a ball is formed at a tip of the bonding wire with energy applied to the bonding wire until when the bonding wire is pressed against the bonding object with the bonding pressurizing tool; and changing at least one junction condition of pressurizing force, pressurizing time, ultrasonic oscillation output, and ultrasonic oscillation time for the subsequent bonding process, based on the measured time.

According to a fifth aspect of the present invention, there is provided a semiconductor assembling apparatus for joining a bonding wire with a bonding object by pressing the bonding wire against the bonding object with a bonding pressurizing tool and by effecting at least either one junction process of thermal junction or ultrasonic junction, the semiconductor assembling apparatus comprising:

a bonding-interval measuring means for measuring a time elapsing from a last bonding process to a subsequent bonding process; and a junction condition changing means for changing at least one junction condition of pressurizing force, pressurizing time, ultrasonic oscillation output, and ultrasonic oscillation time for the subsequent bonding process, based on the measured time.

According to a sixth aspect of the present invention, there is provided a semiconductor assembling apparatus for joining a bonding wire with a bonding object by pressing the bonding wire against the bonding object with a bonding pressurizing tool and by effecting at least either one junction process of thermal junction or ultrasonic junction, the semiconductor assembling apparatus comprising:

a pressurizing tool temperature measuring means for detecting a temperature of the pressurizing tool; and a junction condition changing means for changing at least one junction condition of pressurizing force, pressurizing time, ultrasonic oscillation output, and ultrasonic oscillation time for the subsequent bonding process, based on the measured temperature of the pressurizing tool.

According to a seventh aspect of the present invention, there is a semiconductor assembling apparatus for joining a bonding wire with a bonding object by pressing the bonding wire against the bonding object with a bonding pressurizing tool and by effecting at least either one junction process of thermal junction or ultrasonic junction, the semiconductor assembling apparatus comprising:

a ball forming means for forming a ball at a tip of the bonding wire with energy applied to the bonding wire;

a time measuring means for measuring a time elapsing from the formation of the ball at the tip of the bonding wire by the ball forming means until the subsequent bonding process; and a junction condition changing means for changing at least one junction condition of pressurizing force, pressurizing time, ultrasonic oscillation output, and ultrasonic oscillation time for the subsequent bonding process, based on the measured time.

According to an eighth aspect of the present invention, there is provided a semiconductor assembling apparatus for joining a bonding wire with a bonding object by pressing the bonding wire against the bonding object with a bonding pressurizing tool and by effecting at least either one junction process of thermal junction or ultrasonic junction, the semiconductor assembling apparatus comprising:

a ball forming means for forming a ball at a tip of the bonding wire with energy applied to the bonding wire;

a temperature measuring means for measuring a temperature of the tip of the bonding wire; and a junction condition changing means for changing at least one junction condition of pressurizing force, pressurizing time, ultrasonic oscillation output, and ultrasonic oscillation time for the subsequent bonding process, based on the measured temperature.

BRIEF DESCRIPTION OF THE DRAWINGS

These and other objects and features of the present invention will become clear from the following description taken in conjunction with the preferred embodiments thereof with reference to the accompanying drawings, in which.

DETAILED DESCRIPTION OF THE PREFERRED EMBODIMENTS

Figure 1:
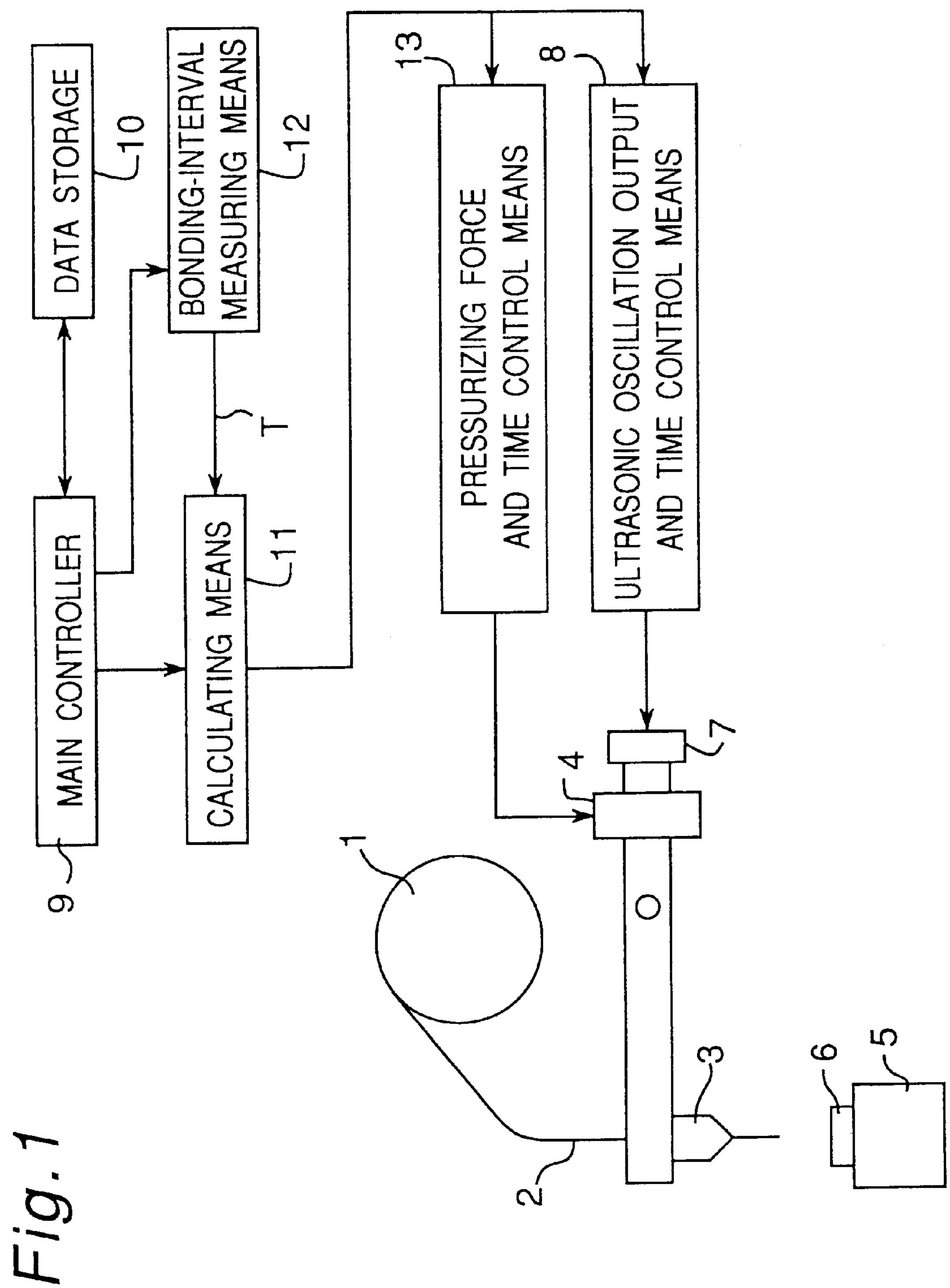
FIG. 1 is an arrangement view of an apparatus for joining semiconductor chips according to a first embodiment of the present invention.

Before the description of the present invention proceeds, it is to be noted that like parts are designated by like reference numerals throughout the accompanying drawings.

Embodiments of the present invention are described hereinbelow with reference to FIGS. 1 to 4.

FIG. 1 shows a first embodiment of the invention.

The first embodiment is an example in which, based on measurement results obtained from a bonding-interval measuring means which is set on a wire bonding equipment of the thermosonic-junction ball bonding or wedge bonding method and which measures the time elapsing from the last bonding process to the subsequent bonding process, the assembling process is carried out by changing part or all of pressurizing force, pressurizing time, ultrasonic oscillation output, and ultrasonic oscillation time.

The wire bonding equipment feeds a bonding wire 2 from a wire feeder 1 to a bonding pressurizing tool 3 by an optimum length by an unshown drive method, and presses the bonding pressurizing tool 3 against a bonding object 6 by a pressurizer 4. The object 6 is an external lead of a semiconductor chip or lead frame. Designated by reference numeral 5 is a heater for heating the bonding object 6. The pressurizer 4 is implemented by an AC servo motor, linear motor, air cylinder or the like. The pressurizing tool 3 is so arranged that ultrasonic waves generated from an ultrasonic oscillator 7 are transferred to the wire 2 of the junction part.

A main controller 9 for controlling the whole bonding process reads the data of pressurizing force, pressurizing time, ultrasonic oscillation output, and ultrasonic oscillation time from a data storage 10, and outputs them to a calculating means 11.

The calculating means 11 is so arranged as to change the data according to measured time T obtained from an interval measuring means 12 that measures the time elapsing from the last bonding process to the subsequent bonding process and to send commands to a pressurizing force and time control means 13 and an ultrasonic oscillation output and time control means 8. The calculating means 11 is also arranged so as to strengthen the junction conditions when the measured time T has become a prolonged one which is longer than an allowable interval time between the continuously bonding processes. For example, when an ordinary interval time between the continuously bonding processes is 0.1 seconds and the measured time T is within an allowable interval time of 10 seconds, the junction condition is not changed because the measure time T is within the allowable area. When the measured time T is longer than the allowable interval time of 10 seconds, the junction condition(s) is changed. Strengthening the junction conditions means increasing the pressurizing force, or prolonging the pressurizing time, or increasing the ultrasonic oscillation output, or prolonging the ultrasonic oscillation time. In order to avoid any damage to the object 6 by excessively increasing the pressurizing force, it is preferable that the pressurizing force is increased to a small extent and the ultrasonic oscillation output is increased. The strengthening of the junction conditions also merely means that all junction conditions are increased. That is, the strengthening of the junction conditions also means that the pressurizing time is decreased while the pressurizing force is increased so as to increase junction energy, and that the ultrasonic oscillation time is decreased while the ultrasonic oscillation output is increased so as to increase junction energy.

The pressurizing force and time control means 13 controls the pressurizer 4 in compliance with the command given from the calculating means 11. The ultrasonic oscillation output and time control means 8 controls the ultrasonic oscillator 7 in compliance with the command given from the calculating means 11.

Explaining according to the junction procedure, the main controller 9 makes the bonding-interval measuring means 12 started at the time of bonding pressurization. In the subsequent bonding process, the calculating means 11 receives the measured time T from the bonding-interval measuring means 12, receives bonding condition data read from the data storage 10 via the main controller 9, performs predetermined calculation, and issues commands to the pressurizing force and time control means 13 and the ultrasonic oscillation output and time control means 8. The calculation as one example is performed by the calculation means 11 as follows: A table showing relationship between the measured time T and the to-be-strengthened data of pressurizing force, pressurizing time, ultrasonic oscillation output, and ultrasonic oscillation time is stored in the data storage 10. Then, based on the measured time T, the to-be-strengthened data and the to-be-increased value thereof for strengthening are read from the table by the calculating means 11 and are sent as the commands to the pressurizing force and time control means 13 and the ultrasonic oscillation output and time control means 8 by the calculating means 11. The calculation can be performed by using an equation showing relationship between the measured time T and the to-be-strengthened data of pressurizing force, pressurizing time, ultrasonic oscillation output, and ultrasonic oscillation time which is stored in the data storage 10.

The bonding wire 2 is pressurized against the bonding object 6 by the pressurizing tool 3, and ultrasonic oscillation is further effected, by which the junction of the bonding wire 2 and the bonding object 6 is completed.

As a result, since the junction conditions can be strengthened by detecting bonding intervals, any deterioration in the bondability can be prevented.

In addition, it is apparent that the ultrasonic oscillator 7 and the ultrasonic oscillation output and time control means 8 are unnecessary when a thermal junction method alone is used as the junction method, and that the heater 5 is unnecessary when an ultrasonic junction alone is used.

Figure 2:
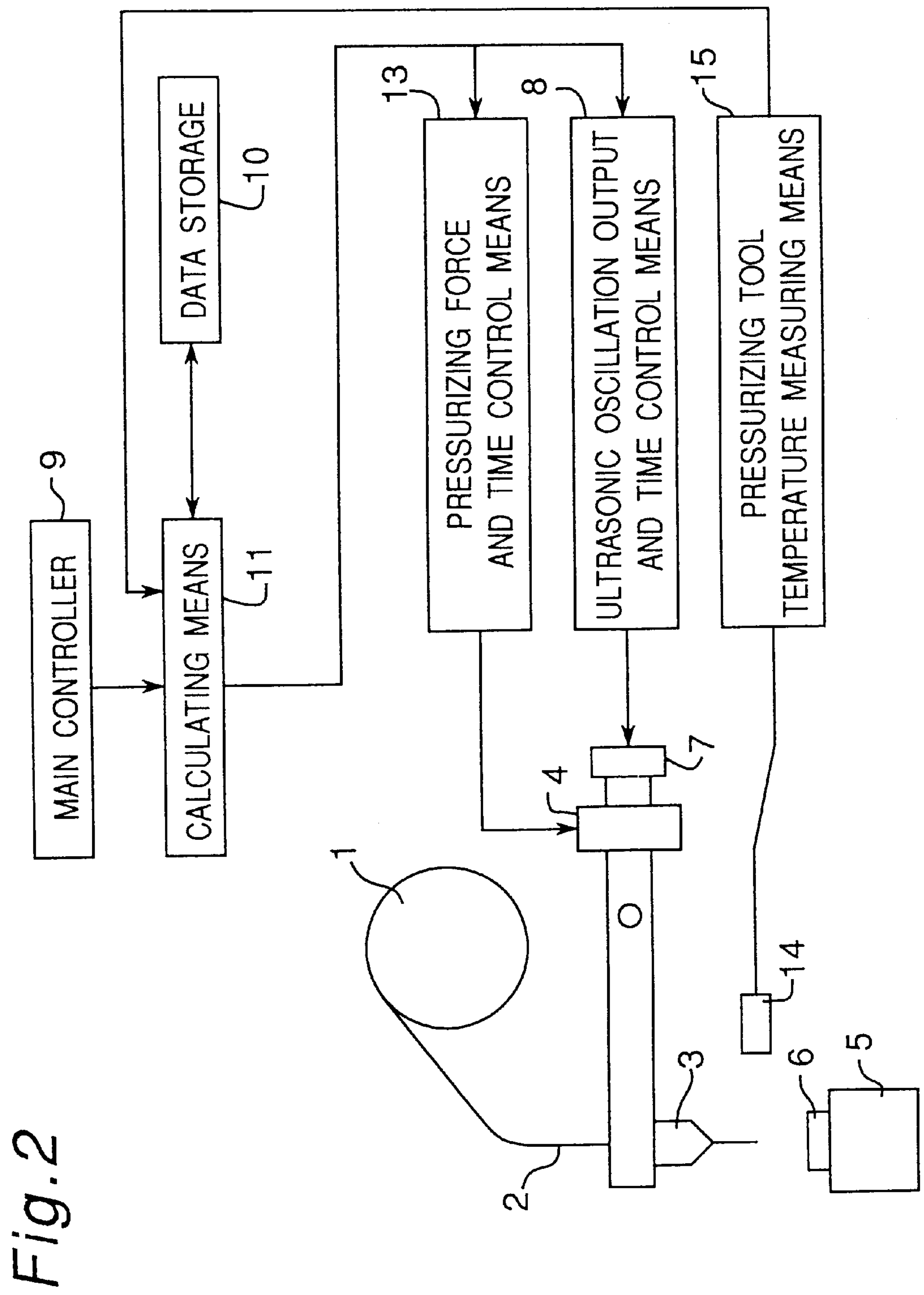
FIG. 2 is an arrangement view of an apparatus for joining semiconductor chips according to a second embodiment of the present invention.

FIG. 2 shows a second embodiment of the present invention.

The second embodiment is an example in which the assembling process is carried out by changing part or all of the pressurizing force, pressurizing time, ultrasonic oscillation output, and ultrasonic oscillation time based on a result obtained from a pressurizing tool temperature measuring means.

Reference numeral 14 denotes a pressurizing tool temperature measuring sensor for measuring the temperature of the pressurizing tool 3. The pressurizing tool temperature measuring sensor 14 is exemplified by a thermocouple or non-contact heat sensor. Designated by numeral 15 is a pressurizing tool temperature measuring means for measuring the temperature of the pressurizing tool based on an output of the pressurizing tool temperature measuring sensor 14. The other components including the wire feeder 1, the bonding wire 2, the pressurizing tool 3, the pressurizer 4, the heater 5, the bonding object 6, the ultrasonic oscillator 7, the ultrasonic oscillation output and time control means 8, the main controller 9, and the data storage 10 are the same as in the first embodiment.

The calculating means 11 of this second embodiment is so connected as to change the data based on the measured temperature obtained from the pressurizing tool temperature measuring means 15, and to send commands to the pressurizing force and time control means 13 and the ultrasonic oscillation output and time control means 8. The calculating means 11 strengthens the junction conditions when the measured temperature has become a lowered one which is lower than an allowable temperature at the bonding process. For example, in a case where an ordinary temperature at the bonding process is 100° C., when the measured temperature is lower than 100° C. and equal to or higher than an allowable temperature of 50° C., the junction condition is not changed because the measure temperature is within the allowable area. When the measured temperature is lower than the allowable temperature of 50° C., the junction condition(s) is changed.

During the bonding process, the calculating means 11 receives the measured temperature from the pressurizing tool temperature measuring means 15, receives bonding condition data from the data storage 10, performs predetermined calculation, and issues commands to the pressurizing force and time control means 13 and the ultrasonic oscillation output and time control means 8. The calculation as one example is performed by the calculation means 11 as follows: A table showing relationship between the measured temperature and the to-be-strengthened data of pressurizing force, pressurizing time, ultrasonic oscillation output, and ultrasonic oscillation time is stored in the data storage 10. Then, based on the measured temperature, the to-be-strengthened data and the to-be-increased value thereof for strengthening are read from the table by the calculating means 11 and are sent as the commands to the pressurizing force and time control means 13 and the ultrasonic oscillation output and time control means 8 by the calculating means 11. The calculation can be performed by using an equation showing relationship between the measured temperature and the to-be-strengthened data of pressurizing force, pressurizing time, ultrasonic oscillation output, and ultrasonic oscillation time which is stored in the data storage 10.

The bonding wire 2 is pressurized against the bonding object 6 by the pressurizing tool 3, and ultrasonic oscillation is further effected, by which the junction of the bonding wire 2 and the bonding object 6 is completed.

As a result, since the junction conditions can be strengthened by detecting the temperature of the pressurizing tool, any deterioration in the bondability can be prevented.

Figure 3:
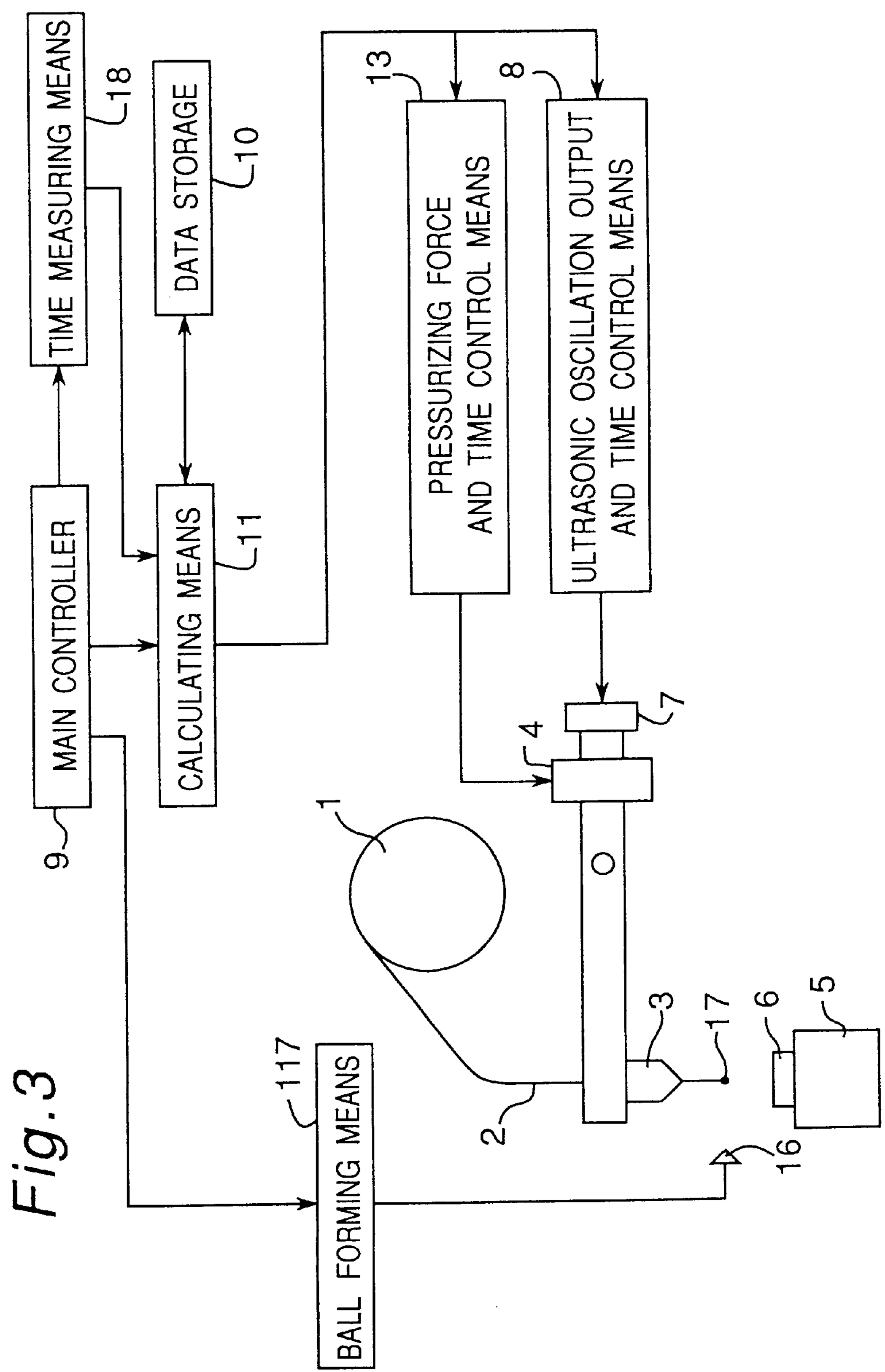
FIG. 3 is an arrangement view of an apparatus for joining semiconductor chips according to a third embodiment of the present invention.

FIG. 3 shows a third embodiment of the present invention.

The third embodiment is an example in which the assembling process is carried out by changing part or all of the pressurizing force, pressurizing time, ultrasonic oscillation output, and ultrasonic oscillation time based on a result obtained from a time measuring means that measures the time elapsing after the formation of a ball until the subsequent bonding process.

Referring to FIG. 3, reference numeral 16 denotes an energy generator that imparts energy to the tip of the wire 2 so that a ball 17 is formed at the tip of the wire 2 by a ball forming means 117. The energy generator 16 is exemplified by a high-voltage discharge device, as an example.

The calculating means 11 is so arranged as to change the data based on the measured time obtained from a time measuring means 18 that measures the time after the formation of the ball 17 until the subsequent bonding process, and to send commands to the pressurizing force and time control means 13 and the ultrasonic oscillation output and time control means 8. The calculating means 11 strengthens the junction conditions when the measured time has become a prolonged one which is longer than an allowable interval time after the formation of the ball 17 until the subsequent bonding process. For example, when an ordinary interval time is 0.1 seconds and the measured time is within an allowable interval time of 10 seconds, the junction condition is not changed because the measure time is within the allowable area. When the measured time is longer than the allowable interval time of 10 seconds, the junction condition (s) is changed. The other components including the wire feeder 1, the bonding wire 2, the bonding pressurizing tool 3, the pressurizer 4, the heater 5, the bonding object 6, the ultrasonic oscillator 7, the ultrasonic oscillation output and time control means 8, the main controller 9, and the data storage 10 are the same as in the first embodiment.

During the bonding process, the calculating means 11 receives the measured time from the time measuring means 18, receives bonding condition data from the data storage 10, performs predetermined calculation, and issues commands to the pressurizing force and time control means 13 and the ultrasonic oscillation output and time control means 8. The calculation as one example is performed by the calculation means 11 as follows: A table showing relationship between the measured time after the formation of the ball 17 until the subsequent bonding process and the to-be-strengthened data of pressurizing force, pressurizing time, ultrasonic oscillation output, and ultrasonic oscillation time is stored in the data storage 10. Then, based on the measured time, the to-be-strengthened data and the to-be-increased value thereof for strengthening are read from the table by the calculating means 11 and are sent as the commands to the pressurizing force and time control means 13 and the ultrasonic oscillation output and time control means 8 by the calculating means 11. The calculation can be performed by using an equation showing relationship between the measured time and the to-be-strengthened data of pressurizing force, pressurizing time, ultrasonic oscillation output, and ultrasonic oscillation time which is stored in the data storage 10.

The bonding wire 2 is pressurized against the bonding object 6 by the pressurizing tool 3, and ultrasonic oscillation is further effected, by which the junction of the bonding wire 2 and the bonding object 6 is completed.

As a result, since the junction conditions can be strengthened by detecting the time after the formation of the ball, any deterioration in the bondability can be prevented.

Figure 4:
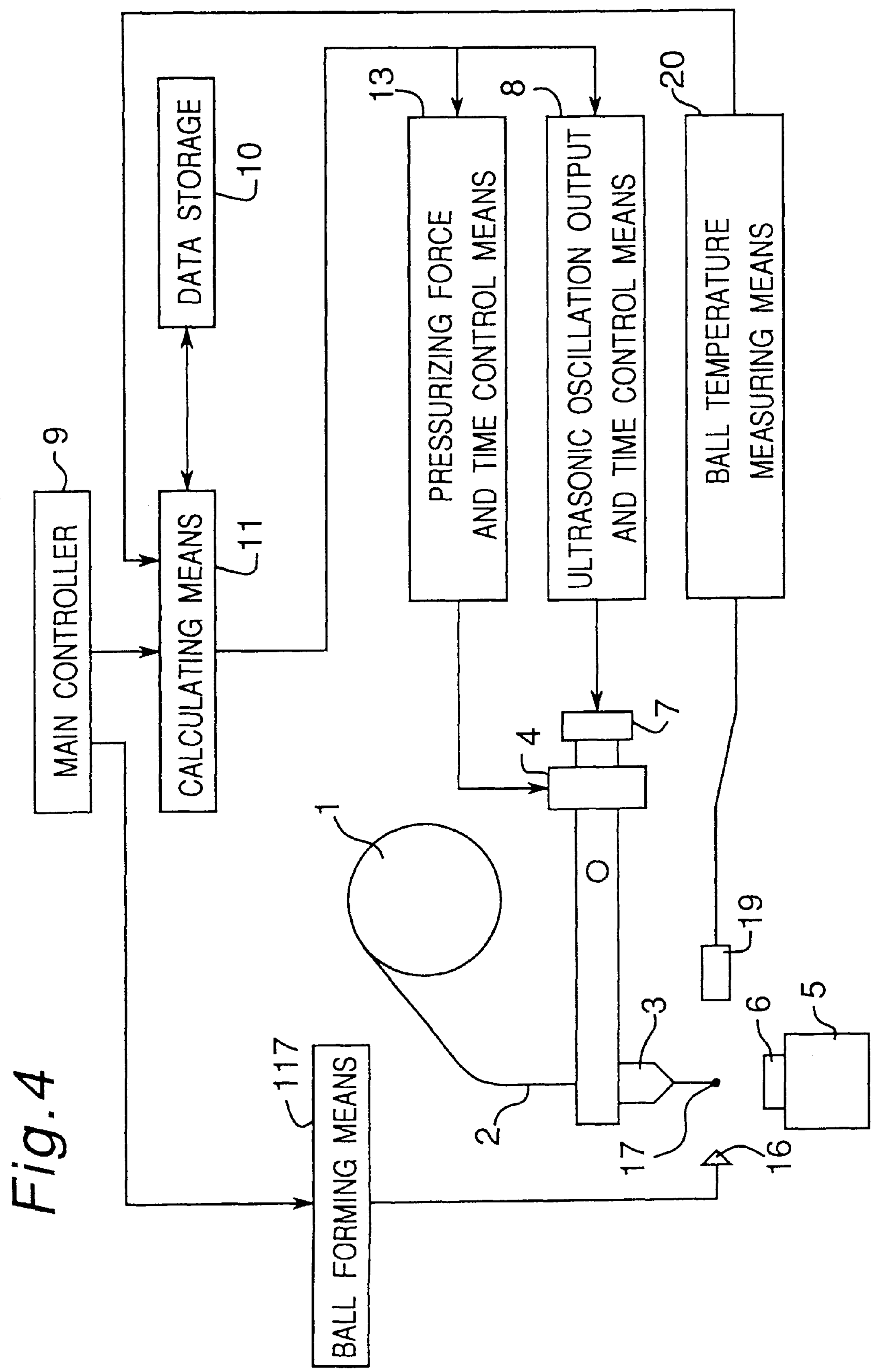
FIG. 4 is an arrangement view of an apparatus for joining semiconductor chips according to a fourth embodiment of the present invention.

FIG. 4 shows a fourth embodiment of the present invention.

The fourth embodiment is an example in which the assembling process is carried out by changing part or all of the pressurizing force, pressurizing time, ultrasonic oscillation output, and ultrasonic oscillation time based on a result obtained from a ball temperature measuring means.

Reference numeral 19 denotes a ball temperature measuring sensor, which is exemplified by a non-contact heat sensor, as an example. Designated by numeral 20 is a ball temperature measuring means for measuring the temperature of the ball 17 based on an output of the ball temperature measuring sensor 19. The other components including the wire feeder 1, the bonding wire 2, the bonding pressurizing tool 3, the pressurizer 4, the heater 5, the bonding object 6, the ultrasonic oscillator 7, the ultrasonic oscillation output and time control means 8, the main controller 9, and the data storage 10 are the same as in the first embodiment.

The calculating means 11 is so arranged as to change the data based on the measured temperature obtained from the ball temperature measuring means 20 that measures the temperature of the ball 17 formed by the ball forming means 117 and to send commands to the pressurizing force and time control means 13 and the ultrasonic oscillation output and time control means 8. The calculating means 11 strengthens the junction conditions when the measured temperature has become a lowered one which is lower than an allowable ball temperature at the ball bonding process. For example, in a case where an ordinary ball temperature at the ball bonding process is 100° C., when the measured temperature is lower than 100° C. and equal to or higher than an allowable ball temperature of 50° C., the junction condition is not changed because the measure temperature is within an allowable area. When the measured temperature is lower than the allowable ball temperature of 50° C., the junction condition (s) is changed.

During the bonding process, the calculating means 11 receives the measured temperature from the ball temperature measuring means 20, receives bonding condition data from the data storage 10, performs predetermined calculation, and issues commands to the pressurizing force and time control means 13 and the ultrasonic oscillation output and time control means 8. The calculation as one example is performed by the calculation means 11 as follows: A table showing relationship between the measured ball temperature and the to-be-strengthened data of pressurizing force, pressurizing time, ultrasonic oscillation output, and ultrasonic oscillation time is stored in the data storage 10. Then, based on the measured ball temperature, the to-be-strengthened data and the to-be-increased value thereof for strengthening are read from the table by the calculating means 11 and are sent as the commands to the pressurizing force and time control means 13 and the ultrasonic oscillation output and time control means 8 by the calculating means 11. The calculation can be performed by using an equation showing relationship between the measured temperature and the to-be-strengthened data of pressurizing force, pressurizing time, ultrasonic oscillation output, and ultrasonic oscillation time which is stored in the data storage 10.

The bonding wire 2 is pressurized against the bonding object 6 by the pressurizing tool 3, and ultrasonic oscillation is further effected, by which the junction of the bonding wire 2 and the bonding object 6 is completed.

As a result, since the junction conditions can be strengthened by detecting any decrease in the ball temperature, any deterioration in the bondability can be prevented.

In addition, even if the change of the junction conditions is made on only any one of the pressurizing time, pressurizing force, ultrasonic oscillation output, and ultrasonic oscillation time, it is possible to improve the bondability. Therefore, without the need of necessarily storing all the data by the data storage 10, the bonding method and bonding apparatus may be implemented with some of the data fixed.

Although the apparatuses according to the first and second embodiments have no ball forming means 117 shown in FIGS. 3 and 4, each of the apparatuses can have such a ball forming means 117 shown in FIGS. 3 and 4 for performing the similar ball bonding process.

The allowable times and temperatures described in the first through fourth embodiments can be set based on various kinds of requirements at the junction processes.

As described above, according to the present invention, even if the interval from one bonding process to another is prolonged, for example, during the transfer process of semiconductor chips or at a restart after a halt, the junction of wire and object can be accomplished without being affected by any decrease in the temperature of the pressurizing tool or the ball. Thus, the bondability will never be deteriorated, advantageously.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A semiconductor assembling method for joining a bonding wire with a bonding object by pressing the bonding wire against the bonding object with a bonding pressurizing tool and by effecting at least either one junction process of thermal junction or ultrasonic junction, the semiconductor assembling method comprising steps of:

measuring a time elapsing from a last bonding process to a subsequent bonding process; and changing at least one junction condition of pressurizing force, pressurizing time, ultrasonic oscillation output, and ultrasonic oscillation time for the subsequent bonding process, based on the measured time.

2. The semiconductor assembling method as claimed in claim 1, wherein in the changing step, when the measured time is longer than an allowable interval time between continuously bonding processes, the junction condition is strengthened.

3. The semiconductor assembling method as claimed in claim 1, further comprising a step of forming a ball at a tip of the bonding wire with energy applied to the bonding wire, wherein the junction process is accomplished by pressing the ball against the bonding object with the bonding pressurizing tool.

4. A semiconductor assembling method for joining a bonding wire with a bonding object by pressing the bonding wire against the bonding object with a bonding pressurizing tool and by effecting at least either one junction process of thermal junction or ultrasonic junction, the semiconductor assembling method comprising steps of:

measuring a temperature of the pressurizing tool; and changing at least one junction condition of pressurizing force, pressurizing time, ultrasonic oscillation output, and ultrasonic oscillation time for the subsequent bonding process, based on the measured temperature.

5. The semiconductor assembling method as claimed in claim 4, wherein in the changing step, when the measured temperature is lower than an allowable temperature at the bonding process, the junction condition is strengthened.

6. The semiconductor assembling method as claimed in claim 4, further comprising a step of forming a ball at a tip of the bonding wire with energy applied to the bonding wire, wherein the junction process is accomplished by pressing the ball against the bonding object with the bonding pressurizing tool.

7. A semiconductor assembling method for joining a bonding wire with a bonding object by forming a ball at a tip of the bonding wire with energy applied to the bonding wire, by pressing the bonding wire against the bonding object with a bonding pressurizing tool, and by effecting at least either one junction process of thermal junction or ultrasonic junction, the semiconductor assembling method comprising steps of:

measuring a temperature of the tip of the bonding wire; and changing at least one junction condition of pressurizing force, pressurizing time, ultrasonic oscillation output, and ultrasonic oscillation time for the subsequent bonding process, based on the measured temperature.

8. The semiconductor assembling method as claimed in claim 7, wherein in the changing step, when the measured temperature is lower than an allowable temperature at the bonding process, the junction condition is strengthened.

9. A semiconductor assembling method for joining a bonding wire with a bonding object by pressing the bonding wire against the bonding object with a bonding pressurizing tool and by effecting at least either one junction process of thermal junction or ultrasonic junction, the semiconductor assembling method comprising steps of:

measuring a time elapsing from when a ball is formed at a tip of the bonding wire with energy applied to the bonding wire until when the bonding wire is pressed against the bonding object with the bonding pressurizing tool; and changing at least one junction condition of pressurizing force, pressurizing time, ultrasonic oscillation output, and ultrasonic oscillation time for the subsequent bonding process, based on the measured time.

10. The semiconductor assembling method as claimed in claim 9, wherein in the changing step, when the measured time is longer than an allowable interval time from when the ball is formed at the tip of the bonding wire with energy applied to the bonding wire until when the bonding wire is pressed against the bonding object with the bonding pressurizing tool, the junction condition is strengthened.

* * * * *